US010546775B1

(12) United States Patent
Hong et al.

(10) Patent No.: US 10,546,775 B1
(45) Date of Patent: Jan. 28, 2020

(54) FIELD-EFFECT TRANSISTORS WITH IMPROVED DIELECTRIC GAP FILL

(71) Applicant: GLOBALFOUNDRIES Inc., Grand Cayman (KY)

(72) Inventors: Wei Hong, Clifton Park, NY (US); Liu Jiang, Clifton Park, NY (US); Yongjun Shi, Clifton Park, NY (US); Yi Qi, Niskayuna, NY (US); Hsien-Ching Lo, Clifton Park, NY (US); Hui Zang, Guilderland, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/052,085

(22) Filed: Aug. 1, 2018

(51) Int. Cl.
| *H01L 21/70* | (2006.01) |
| *H01L 21/768* | (2006.01) |
| *H01L 27/12* | (2006.01) |
| *H01L 29/66* | (2006.01) |
| *H01L 21/28* | (2006.01) |
| *H01L 21/84* | (2006.01) |
| H01L 21/762 | (2006.01) |
| H01L 29/78 | (2006.01) |

(52) U.S. Cl.
CPC .. *H01L 21/76837* (2013.01); *H01L 21/28247* (2013.01); *H01L 21/76897* (2013.01); *H01L 21/84* (2013.01); *H01L 27/1207* (2013.01); *H01L 29/665* (2013.01); H01L 21/76283 (2013.01); H01L 29/7843 (2013.01)

(58) Field of Classification Search
CPC ............... H01L 21/76837; H01L 21/84; H01L 21/76897; H01L 29/665; H01L 27/1207; H01L 21/28247; H01L 29/7843; H01L 21/76283
See application file for complete search history.

(56) References Cited

U.S. PATENT DOCUMENTS

| 8,765,491 B2 | 7/2014 | Cai et al. | |
| 2008/0179638 A1* | 7/2008 | Dyer | H01L 21/76801 257/288 |
| 2008/0272492 A1 | 11/2008 | Tsang | |
| 2009/0014812 A1* | 1/2009 | Wang | H01L 21/823425 257/392 |
| 2009/0017625 A1* | 1/2009 | Lee | H01L 21/31144 438/694 |
| 2011/0303989 A1* | 12/2011 | Chuang | H01L 23/5256 257/380 |
| 2013/0034946 A1* | 2/2013 | Chuang | H01L 27/0629 438/382 |
| 2016/0163815 A1* | 6/2016 | Hoentschel | H01L 29/665 257/379 |

* cited by examiner

*Primary Examiner* — Ismail A Muse
(74) *Attorney, Agent, or Firm* — Thompson Hine LLP

(57) ABSTRACT

Structures for a field-effect transistor and methods of forming a structure for a field-effect transistor. A first dielectric layer is deposited over a first gate structure in a first device area and a second gate structure in a second device area, and then planarized. A second dielectric layer is deposited over the planarized first dielectric layer, and then removed from the first device area. After removing the second dielectric layer from the first device area, the first dielectric layer in the first device area is recessed to expose the first gate structure. A silicide is formed on the exposed first gate structure.

19 Claims, 5 Drawing Sheets

FIELD-EFFECT TRANSISTORS WITH IMPROVED DIELECTRIC GAP FILL

BACKGROUND

The invention relates generally to integrated circuits and, in particular, to structures for a field-effect transistor and methods of forming a structure for a field-effect transistor.

Complementary-metal-oxide-semiconductor processes may be used to build a combination of p-type and n-type field-effect transistors that are used to construct logic gates and as active components in other types of circuits, such as switches used in radiofrequency circuits. Field-effect transistors generally include a channel region, a source, a drain, and a gate electrode. When a control voltage exceeding a characteristic threshold voltage is applied to the gate electrode, carrier flow occurs in a channel region between the source and drain to produce a device output current.

A semiconductor-on-insulator substrate permits device operation at significantly higher speeds with improved electrical isolation and reduced electrical losses in comparison with field-effect transistors built using a bulk silicon wafer. Contingent on the thickness of a device layer of the semiconductor-on-insulator substrate, a field-effect transistor may operate in a fully-depleted mode in which a depletion layer in the channel region extends fully to a buried oxide layer of the semiconductor-on-insulator substrate when typical control voltages are applied to the gate electrode.

Silicide may be formed on the source, drain and gate electrode of a field-effect transistor to reduce the contact resistance. Before silicidation, a silicide-blocking layer composed of a dielectric material, such as silicon nitride, is deposited and patterned to open areas to be silicided. The patterning of the silicide-blocking layer may form additional sidewall spacers on the gate electrodes as an artifact. After silicidation, a stress liner may be applied as a conformal layer, and an interlayer dielectric layer may be deposited over the stress liner. As the distance between gate electrodes shrinks, the additional sidewall spacers originating from the patterning of the silicide-blocking layer may prevent the stress liner and/or the interlayer dielectric layer from completely filling the space between adjacent gate electrodes and form a void resulting from pinch-off. During subsequent processing to form contacts, the void may become filled by a metal, such as tungsten, and define a metal subway that can produce contact shorting.

Improved structures for a field-effect transistor and methods of forming a structure for a field-effect transistor are needed.

SUMMARY

In an embodiment of the invention, a method includes depositing a first dielectric layer over a first gate structure in a first device area and a second gate structure in a second device area, and then planarizing the first dielectric layer. The method further includes depositing a second dielectric layer over the planarized first dielectric layer, and then removing the second dielectric layer in the first device area. After removing the second dielectric layer in the first device area, the first dielectric layer in the first device area is recessed to expose the first gate structure. A silicide is formed on the exposed first gate structure.

In an embodiment of the invention, a structure includes a first gate structure and a second gate structure separated from the first gate structure by a space, a dielectric layer arranged in the space, a silicide layer on the first gate structure and the second gate structure, and a stress liner extending across the first gate structure and the second gate structure. The stress liner includes a portion arranged in the space and in a vertical direction over the dielectric layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
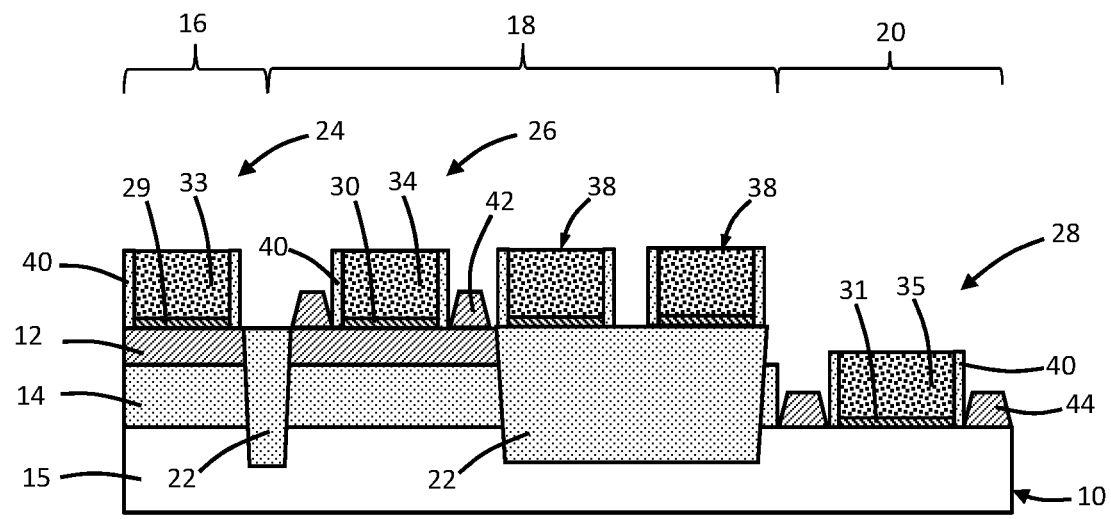
FIGS. 1-9 are cross-sectional views of a structure at successive fabrication stages of a process in accordance with embodiments of the invention.

With reference to FIG. 1 and in accordance with an embodiment of the invention, a silicon-on-insulator (SOI) wafer 10 includes a device layer 12, a buried oxide (BOX) layer 14 composed of an oxide of silicon (e.g., $SiO_2$), and a substrate 15. The device layer 12 is electrically isolated from the substrate 15 by the intervening BOX layer 14 and may be considerably thinner than the substrate 15. The device layer 12 and the substrate 15 may be composed of a single-crystal semiconductor material, such as single-crystal silicon. In an embodiment, the device layer 12 may have a thickness selected to be compatible with the fabrication of fully-depleted SOI devices (FDSOI). The substrate 15 may be lightly doped to have, for example, p-type conductivity.

The device layer 12 may include a device area 16, a device area 18, and a device area 20 that are laterally arranged on the SOI wafer 10. The device layer 12 and the BOX layer 14 are removed from the device area 20 through the use of a lithography and etching process. The device areas 18, 20 may be implanted to provide p-wells and n-wells (not shown) that may be needed for subsequent device formation.

Trench isolation regions 22 are formed that penetrate through the device layer 12 and the BOX layer 14 and extend to a given depth into the substrate 15. The trench isolation regions 22 may be formed by a shallow trench isolation (STI) technique in which trenches are formed, a dielectric material (e.g., silicon dioxide ($SiO_2$)) is deposited to fill the trenches, and the deposited dielectric material is then polished and/or recessed.

Devices structures 24, 26, 28 are respectively formed by front-end-of-line processing in the device areas 16, 18, 20. To that end, a dielectric layer and one or more conductor layers may be deposited and patterned to form a gate dielectric 29 and gate electrode 33 of a gate structure associated with the device structure 24, a gate dielectric 30 and gate electrode 34 of a gate structure associated with the device structure 26, and a gate dielectric 31 and gate electrode 35 of a gate structure associated with the device structure 28. The patterning of the layers also forms dummy gate structures 38 in the device area 18 over the trench isolation region 22. The gate dielectrics 29, 30, 31 may be composed of a dielectric material, such as silicon dioxide ($SiO_2$) or hafnium oxide ($HfO_2$), and the gate electrodes 33, 34, 35 may be composed of a conductor, such as polysilicon. The dummy gate structures 38 include a layered stack of the conductor and dielectric material. The gate structure of the device structure 24 may be a component of a passive device, such as a resistor. Spacers 40 may be formed on the vertical sidewalls of the gate structures of the device structure 24, 26, 28 and the dummy gate structures 38.

Source/drain regions 42 are formed adjacent to the vertical sidewalls of the gate structure of the device structure 26 and are separated from the gate structure by the spacers 40. Source/drain regions 44 are formed adjacent to the vertical sidewalls of the gate structure of the device structure 28 and are separated from the gate structure by the spacers 40. As used herein, the term "source/drain region" means a doped region of semiconductor material that can function as either a source or a drain of a field-effect transistor. The source/drain regions 42 and/or the source/drain regions 44 may be composed of a semiconductor material, such as silicon (Si), formed by an epitaxial growth process, and may be in situ doped during growth provide a given conductivity type (e.g., n-type conductivity for an n-type field-effect transistor). Alternatively, the source/drain regions 42 and/or the source/drain regions 44 may be composed of a semiconductor material, such as silicon germanium (SiGe), formed by an epitaxial growth process, and may be in situ doped during growth to provide a given conductivity type (e.g., p-type conductivity for a p-type field-effect transistor).

The device structure 26 may be an active device in the form of a field-effect transistor that includes a section of the device layer 12 beneath the gate electrode 34 and laterally between the source/drain regions 42 as a channel region. The device structure 28 may be an active device in the form of a field-effect transistor that includes a section of the device layer 12 beneath the gate electrode 35 and laterally between the source/drain regions 44 as a channel region. In the representative embodiment, the source/drain regions 42, 44 are raised relative to the respective channel regions.

Figure 2:
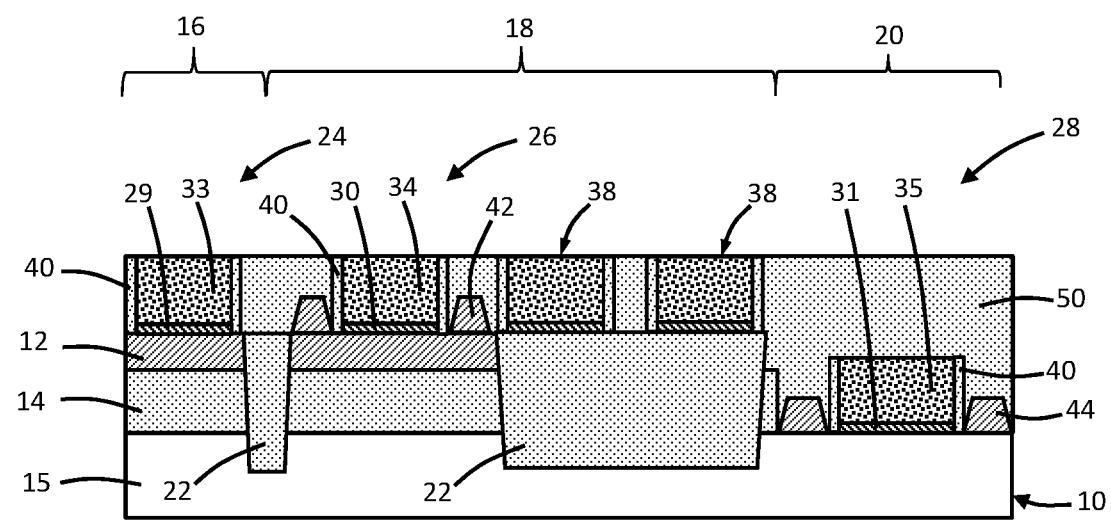

With reference to FIG. 2 in which like reference numerals refer to like features in FIG. 1 and at a subsequent fabrication stage, a dielectric layer 50 is formed that fills the gaps between the device structures 24, 26, 28 and dummy gate structures 38. The dielectric layer 50 may be composed of a dielectric material, such as silicon dioxide (SiO$_2$), deposited by chemical vapor deposition and planarized with chemical-mechanical polishing (CMP). The planarization may stop on the top surfaces of the gate structures associated with the device structures 24, 26 and the dummy gate structures 38. Alternatively, the planarization may be halted with a residual thickness of the dielectric layer 50 remaining over the gate structures of the device structures 24, 26 and the dummy gate structures 38. The device structure 28 is buried beneath the dielectric layer 50 following planarization. The dielectric layer 50 may fill any irregularities in the trench isolation regions 22, such as dishing of the top surface of the trench isolation regions 22 that may be produced, for example, by etches and cleans during processing.

Figure 3:
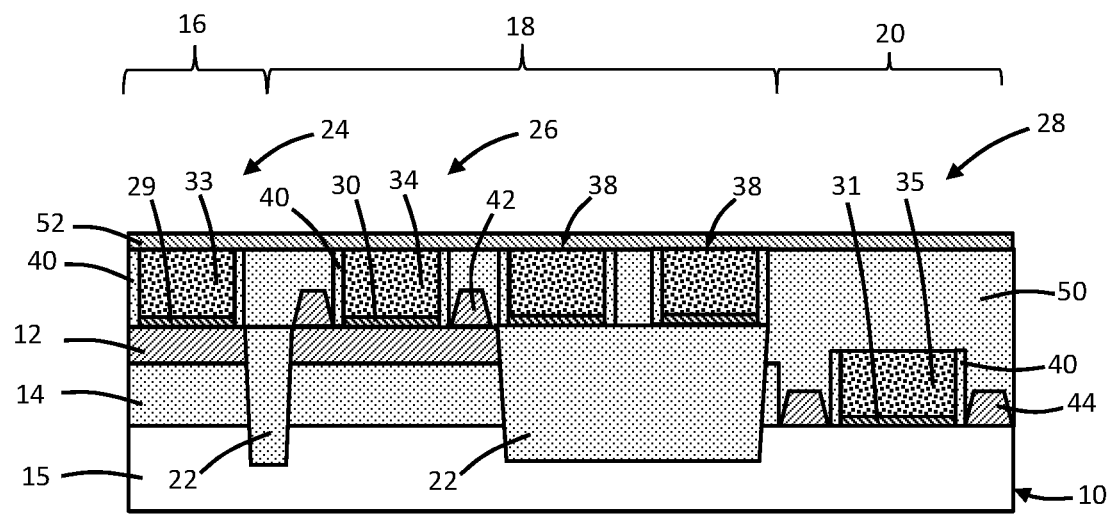

With reference to FIG. 3 in which like reference numerals refer to like features in FIG. 2 and at a subsequent fabrication stage, a protective layer 52 is formed over the dielectric layer 50. The protective layer 52 may be composed of a dielectric material, such as silicon nitride (Si$_3$N$_4$), deposited by chemical vapor deposition (CVD) or atomic layer deposition (ALD). The protective layer 52 may function as a silicide block layer in device area 16. The prior planarization of the dielectric layer 50 provides a flat or nearly flat surface for the deposition of the protective layer 52. In an embodiment, the protective layer 52 is conformally deposited with a uniform thickness and is not polished following deposition.

Figure 4:
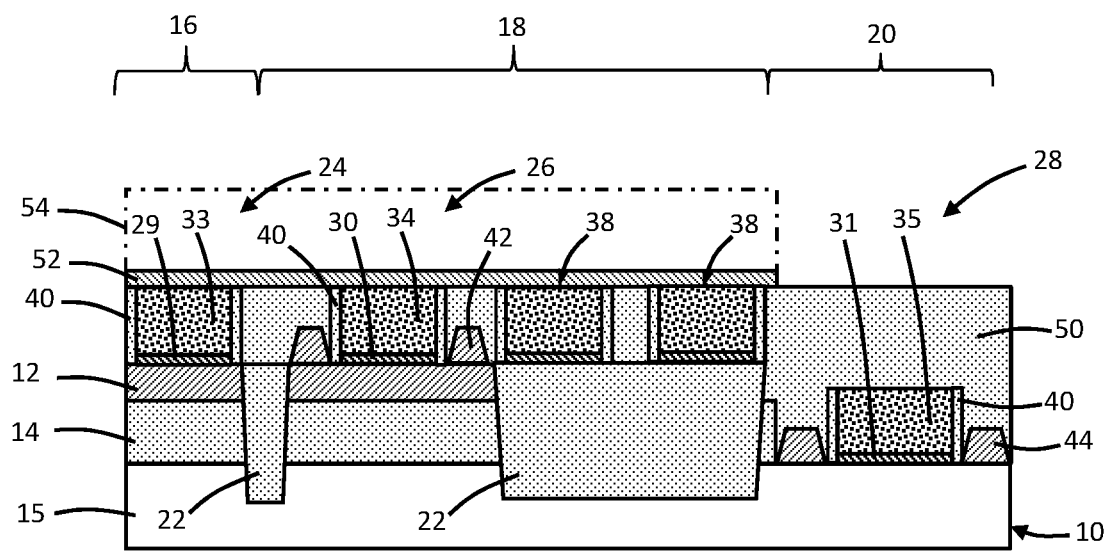

With reference to FIG. 4 in which like reference numerals refer to like features in FIG. 3 and at a subsequent fabrication stage, an etch mask 54 is applied over the protective layer 52, and the protective layer 52 is removed by a lithography and etching process in the device area 20 to expose the underlying section of the dielectric layer 50. To that end, an etch mask 54 is formed by lithography that completely covers the protective layer 52 in device areas 16, 18, and exposes the protective layer 52 in device area 20. The etch mask 54 may be composed of a layer of a photosensitive material, such as an organic photoresist, that is applied as a fluid by a spin coating process, pre-baked, exposed to light projected through a photomask, baked after exposure, and developed with a chemical developer. The portion of the protective layer 52 exposed by the etch mask 54 in device area 20 may be removed using an etching process, such as a wet chemical etching process or reactive ion etching (RIE), with an etch recipe that removes the protective layer 52 selective to the dielectric layer 50. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. The protective layer 52 in device areas 16, 18 is masked by the etch mask 54 during the etching process and preserved. The etch mask 54 is stripped following the completion of the etching process.

Figure 5:
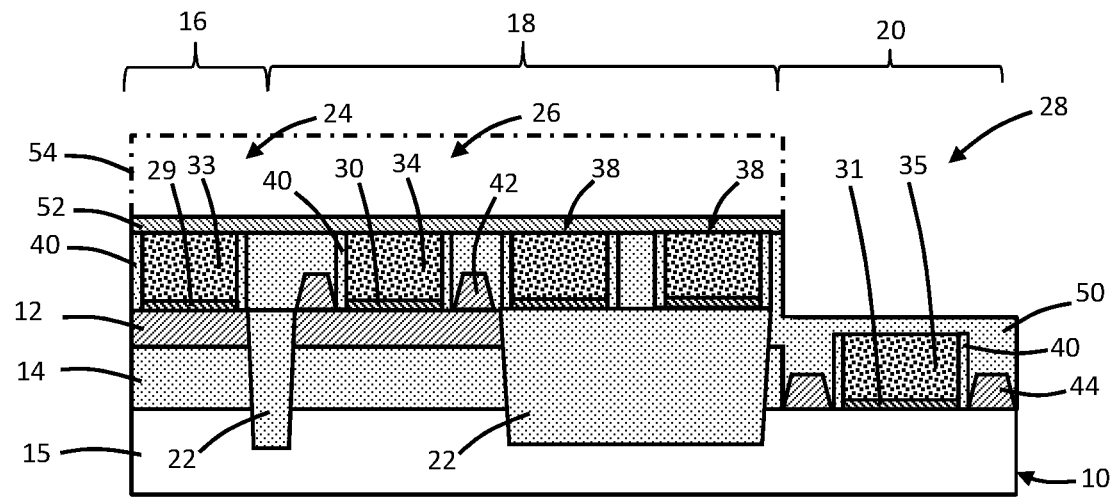

With reference to FIG. 5 in which like reference numerals refer to like features in FIG. 4 and at a subsequent fabrication stage, the dielectric layer 50 is recessed and thinned in the device area 20 by an etching process, such as a reactive ion etching process. The protective layer 52 masks the dielectric layer 50 in device areas 16, 18 during the etching process. Following the etching process, the source/drain regions 44 and gate structure of the device structure 28 in device area 20 may be covered by a thickness of the thinned dielectric layer 50.

Figure 6:
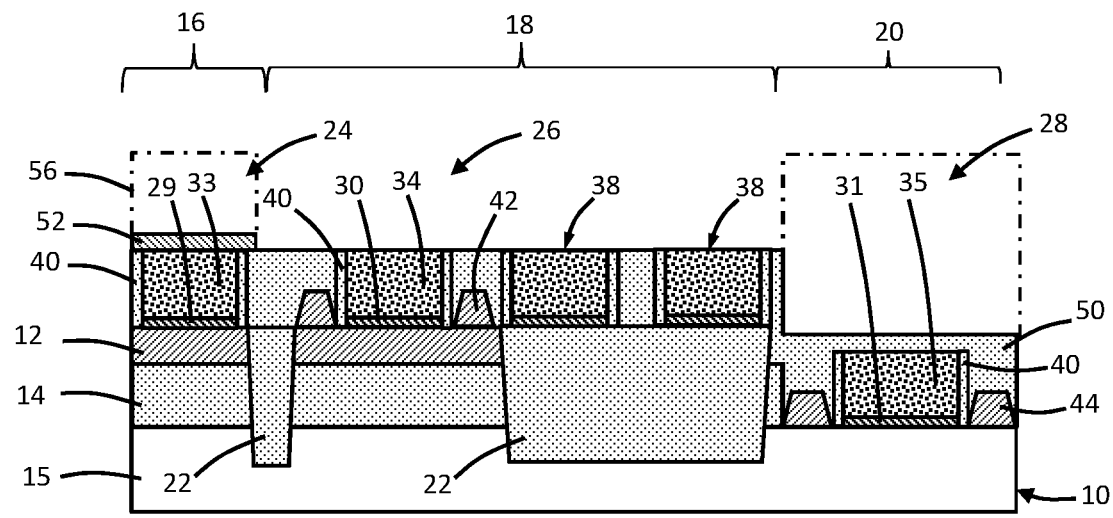

With reference to FIG. 6 in which like reference numerals refer to like features in FIG. 5 and at a subsequent fabrication stage, an etch mask 56 is formed by lithography that covers and masks the device area 16 and device area 20. With the device areas 16, 20 masked, the protective layer 52 is removed from the device area 18 by a lithography and etching process. The etch mask 56 may be composed of a layer of a photosensitive material, such as an organic photoresist, that may be applied by a spin coating process, pre-baked, exposed to light projected through a photomask, baked after exposure, and developed with a chemical developer. The portion of the protective layer 52 exposed by the etch mask 56 in device area 18 may be removed using an etching process, such as a wet chemical etching process or reactive ion etching (RIE), with an etch recipe that removes the protective layer 52 selective to the dielectric layer 50. The etch mask 56 is stripped following the completion of the etching process.

Figure 7:
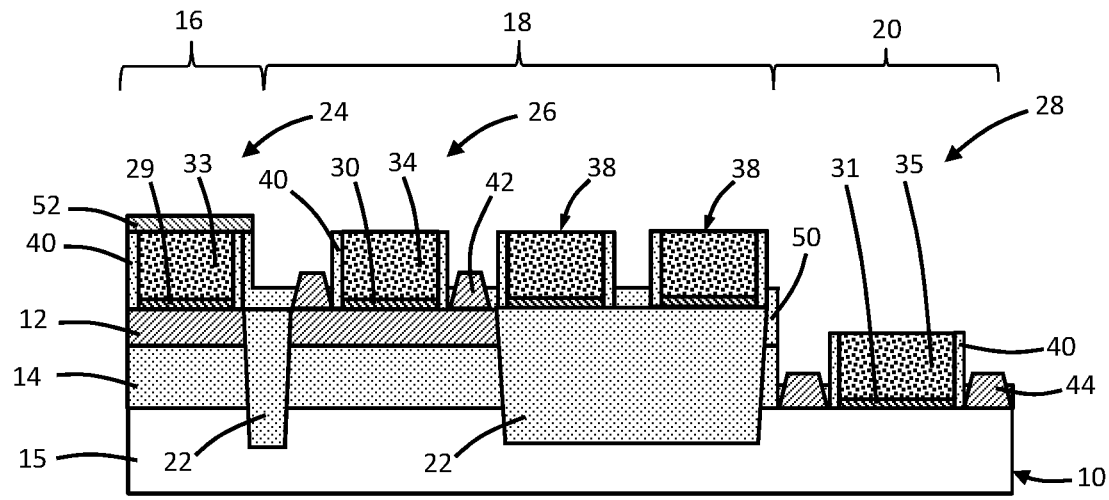

With reference to FIG. 7 in which like reference numerals refer to like features in FIG. 6 and at a subsequent fabrication stage, the dielectric layer 50 is recessed and etched back with an etching process to expose respective upper portions of the gate electrode 34 of the device structure 26, the source/drain regions 42, the dummy gate structures 38, the gate electrode 35 of the device structure 28, and the source/drain regions 44. The protective layer 52 masks the device area 16 and its device structure 24 during the etching process. The etching process may remove the material of the dielectric layer 50 selective to the materials of the gate electrodes 34, 35 of the device structures 26, 28, the dummy gate structures 38, the source/drain regions 42, the source/drain regions 44, and the protective layer 52.

Figure 8:
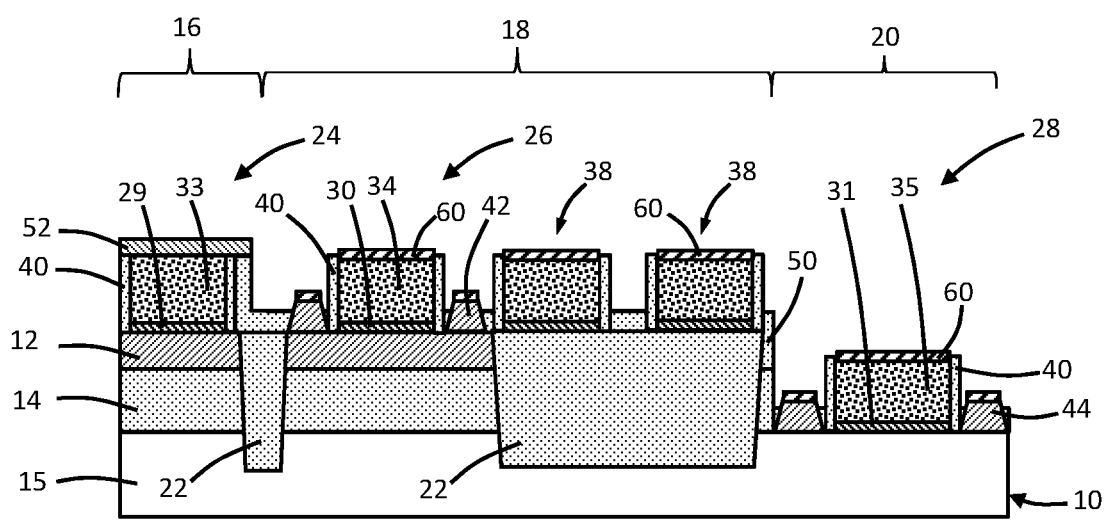

With reference to FIG. 8 in which like reference numerals refer to like features in FIG. 7 and at a subsequent fabrication stage, sections of a silicide layer 60 are respectively formed on the top surfaces of the gate electrodes 34, 35, the dummy gate structures 38, the source/drain regions 42, and the source/drain regions 44. The silicide layer 60 may be formed by a silicidation process involving the deposition of a conformal layer of a silicide-forming metal by, for example, chemical vapor deposition or physical vapor deposition, followed by one or more annealing steps (e.g., rapid thermal annealing) to form a silicide phase by reacting the layer of silicide-forming metal and the contacting semiconductor material. Because the silicide-forming metal does not react with contacted dielectric material, such as the protective layer 52 over the field-effect transistor 24, the silicidation process is self-aligned. Candidate materials for the silicide-forming metal include, but are not limited to, nickel (Ni), titanium (Ti), cobalt (Co), platinum (Pt), or a combination of these metals or other metals capable of reacting with silicon to form a low-resistivity, thermally-stable silicide. Before annealing, a capping layer comprised of a metal nitride, such as sputter-deposited titanium nitride (TiN), may be applied to cover the silicide-forming metal. An initial annealing step of the silicidation process may form a metal-rich silicide that consumes the silicide-forming metal and then form silicides of lower metal content that grow by consuming the metal-rich silicides. The silicide layer may then be subjected to an additional annealing operation at a higher temperature to form a lower-resistance silicide phase of higher metal content. Any remaining silicide-forming metal and the capping layer may be removed by wet chemical etching.

Figure 9:
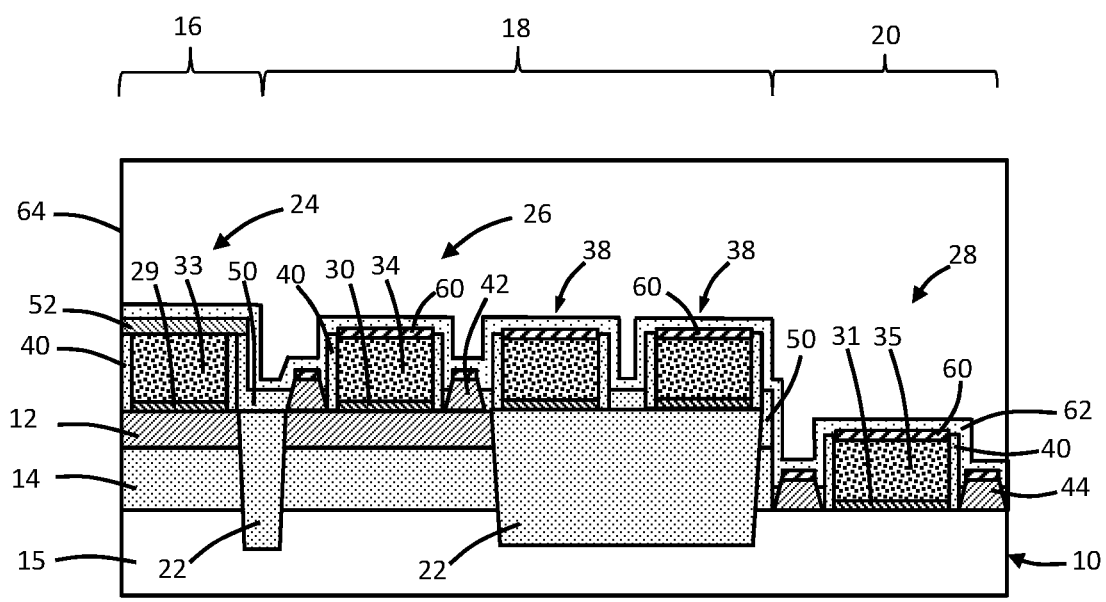

With reference to FIG. 9 in which like reference numerals refer to like features in FIG. 8 and at a subsequent fabrication stage, a stress liner 62 may be formed over all of the device areas 16, 18, 20 after formation of the silicide layer 60. The stress liner 62 may be composed of a dielectric material, such as silicon nitride ($Si_3N_4$), deposited by plasma-enhanced chemical vapor deposition (PECVD) under deposition conditions that cause the material of the stress liner 62 to be under stress and thereby incorporate either compressive strain or tensile strain. The strain is transferred as stress to the device structures 26, 28 and, in particular, to the channel regions of the device structures 26, 28. The stress liner 62 defines sidewall spacers on the gate structures of the device structures 26, 28.

The stress liner 62 is arranged above the device layer 12 defining the channel region of the device structure 26 and over which the device structure 24 is formed. Sections of the recessed and thinned dielectric layer 50 are arranged in a vertical direction between the stress liner 62 and the device layer 12. The stress liner 62 directly contacts the spacers 40 at the sidewalls of the gate structures for the device structures 26, 28 and the stress liner 62 also directly contacts the spacers 40 at the sidewalls of the dummy gate structures 38.

The protective layer 52 is deposited on the planarized dielectric layer 50 instead of being conformally deposited over the uneven topography of device structures 24, 26 and dummy gate structures 38. When the protective layer 52 is opened by etching to perform silicidation, sidewall spacers composed of the dielectric material of the protective layer 52 are not formed on the sidewalls of the gate structures of the device structures 26, 28 and dummy gate structures 38 because of the intervening presence of the dielectric layer 50 between the protective layer 52 and the device structures 26, 28 and dummy gate structures 38. The protective layer 52 is arranged on a planarized surface of the dielectric layer 50 when the protective layer 52 is etched with etch selectivity to the dielectric layer 50.

Middle-of-line (MOL) processing and back-end-of-line (BEOL) processing follows the fabrication of the device structures 24, 26, 28, which includes formation of dielectric layers, via contacts, and wiring for an interconnect structure coupled with the device structures 24, 26, 28. In particular, an interlayer dielectric layer 64 may be formed over the stress liner 62 covering the device structures 24, 26, 28 and contacts (not shown) may be formed in the interlayer dielectric layer 64. The interlayer dielectric layer 64 may be comprised of an electrically-insulating dielectric material, such as silicon dioxide or hydrogen-enriched silicon oxycarbide.

Because additional sidewall spacers originating from the patterning of the protective layer 52 are absent, the stress liner 62 and interlayer dielectric layer 64 may provide more effective gap fill without the formation of voids in locations with tight spacing, such as in the space between the dummy gate structures 38. During subsequent processing, the absence of voids in the stress liner 62 and interlayer dielectric layer 64 that could otherwise be filled by metal may reduce the occurrence of metal subways and contact shorting.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   depositing a first dielectric layer over a first gate structure in a first device area and a second gate structure in a second device area;
   planarizing the first dielectric layer;
   depositing a second dielectric layer over the planarized first dielectric layer;
   removing the second dielectric layer from the first device area;
   after removing the second dielectric layer from the first device area, recessing the first dielectric layer in the first device area to expose the first gate structure; and
   forming a silicide on the exposed first gate structure.

2. The method of claim 1 further comprising:
   forming a stress liner over the first gate structure and the recessed first dielectric layer in the first device area.

3. The method of claim 2 wherein the stress liner directly contacts a sidewall spacer adjacent to the first gate structure.

4. The method of claim 1 wherein the second dielectric layer blocks formation of the silicide on the second gate structure in the second device area.

5. The method of claim 1 wherein the first dielectric layer is deposited over a trench isolation region in the first device area, and a portion of the recessed first dielectric layer is arranged over the trench isolation region.

6. The method of claim 5 wherein the trench isolation region is arranged in a space between the first gate structure and the second gate structure.

7. The method of claim 6 wherein the first gate structure and the second gate structure are exposed when the first dielectric layer is recessed, and further comprising:
   forming a stress liner over the first gate structure, the second gate structure, and the recessed first dielectric layer in the first device area,
   wherein the stress liner fills a first portion of the space over the portion of the recessed first dielectric layer without void formation.

8. The method of claim 7 further comprising:
   forming an interlayer dielectric layer over the stress liner, wherein the interlayer dielectric layer fills a second portion of the space over the portion of the recessed first dielectric layer without void formation.

9. The method of claim 1 wherein the first dielectric layer is deposited over a third gate structure in a third device area, the second dielectric layer is deposited over the planarized first dielectric layer in the third device area, and further comprising:
   before removing the second dielectric layer in the first device area, removing the second dielectric layer from the third device area; and
   after removing the second dielectric layer from the third device area, recessing the first dielectric layer in the third device area without exposing the third gate structure.

10. The method of claim 9 further comprising:
    before removing the second dielectric layer in the first device area, forming an etch mask over the recessed first dielectric layer in the third device area.

11. The method of claim 9 wherein the first dielectric layer is recessed in the third device area when the first dielectric layer is recessed in the first device area to expose the third gate structure, and the silicide is further formed on the exposed third gate structure.

12. The method of claim 9 wherein the first gate structure is arranged over a device layer of a silicon-on-insulator wafer, and further comprising:
    removing the device layer and a buried oxide layer of the silicon-on-insulator wafer from the third device area to expose a substrate of the silicon-on-insulator wafer in the third device area,
    wherein the third gate structure is arranged over the substrate in the third device area.

13. The method of claim 12 wherein the first dielectric layer is recessed in the third device area when the first dielectric layer is recessed in the first device area to expose the third gate structure, and the silicide is further formed on the exposed third gate structure.

14. The method of claim 12 wherein the silicide is concurrently formed on the exposed first gate structure and the exposed third gate structure.

15. The method of claim 1 wherein a source/drain region is exposed when the first dielectric layer is recessed in the first device area, and the silicide is further formed on the exposed source/drain region.

16. The method of claim 15 wherein the silicide is concurrently formed on the exposed first gate structure and the exposed source/drain region.

17. The method of claim 1 wherein the first dielectric layer comprises silicon dioxide, and the second dielectric layer comprises silicon nitride.

18. The method of claim 2 wherein the stress liner comprises silicon nitride.

19. The method of claim 7 wherein the stress liner comprises silicon nitride.

* * * * *